United States Patent
Hoshi et al.

(10) Patent No.: US 9,165,777 B2
(45) Date of Patent: *Oct. 20, 2015

(54) POLISHING AGENT AND METHOD FOR POLISHING SUBSTRATE USING THE POLISHING AGENT

(71) Applicant: Hitachi Chemical Company, Ltd., Tokyo (JP)

(72) Inventors: Yousuke Hoshi, Tsukuba (JP); Daisuke Ryuzaki, Kodaira (JP); Naoyuki Koyama, Tsukuba (JP); Shigeru Nobe, Hitachi (JP)

(73) Assignee: HITACHI CHEMICAL COMPANY, LTD. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/891,064

(22) Filed: May 9, 2013

(65) Prior Publication Data

US 2013/0252426 A1 Sep. 26, 2013

Related U.S. Application Data

(63) Continuation of application No. 12/988,898, filed as application No. PCT/JP2009/057956 on Apr. 22, 2009, now Pat. No. 8,617,275.

(30) Foreign Application Priority Data

| Apr. 23, 2008 | (JP) | 2008-112443 |
|---|---|---|
| Apr. 23, 2008 | (JP) | 2008-112444 |
| Apr. 23, 2008 | (JP) | 2008-112445 |
| Nov. 26, 2008 | (JP) | 2008-301277 |
| Nov. 26, 2008 | (JP) | 2008-301285 |
| Nov. 26, 2008 | (JP) | 2008-301298 |

(51) Int. Cl.
| C09G 1/02 | (2006.01) |
|---|---|
| H01L 21/306 | (2006.01) |
| B24B 37/04 | (2012.01) |
| C09K 3/14 | (2006.01) |
| H01L 21/3105 | (2006.01) |

(52) U.S. Cl.
CPC ........ H01L 21/30625 (2013.01); B24B 37/044 (2013.01); C09G 1/02 (2013.01); C09K 3/1463 (2013.01); H01L 21/31053 (2013.01)

(58) Field of Classification Search
CPC ........... C09G 1/02; C09K 3/1463; C09K 3/14
USPC .............. 51/293, 298, 307; 451/28; 438/692–693; 252/79.1
See application file for complete search history.

(56) References Cited

U.S. PATENT DOCUMENTS

| 6,561,876 | B1 | 5/2003 | Tateyama et al. |
|---|---|---|---|
| 2004/0065022 | A1 | 4/2004 | Machii et al. |
| 2004/0186206 | A1 | 9/2004 | Yoneda et al. |
| 2006/0010781 | A1* | 1/2006 | Ikeda et al. ............ 51/309 |
| 2006/0099814 | A1* | 5/2006 | Carter et al. ............ 438/692 |
| 2006/0229000 | A1 | 10/2006 | Izumi et al. |
| 2006/0289826 | A1 | 12/2006 | Koyama et al. |

FOREIGN PATENT DOCUMENTS

| CN | 1517424 | 8/2004 |
|---|---|---|
| CN | 1795543 | 12/2006 |
| CN | 1905991 | 1/2007 |
| CN | 101130665 | 2/2008 |
| CN | 101177602 | 5/2008 |
| JP | 08-022970 | 1/1996 |
| JP | 10-106994 | 4/1998 |
| JP | 2000-109808 | 4/2000 |
| JP | 2000-109809 | 4/2000 |
| JP | 2001-007061 | 1/2001 |
| JP | 2002-110596 | 4/2002 |
| JP | 2005-236275 | 9/2005 |
| JP | 2007-311779 | 11/2007 |
| JP | 2008-091524 | 4/2008 |
| TW | 460964 | 10/2001 |
| TW | 1278507 | 4/2007 |
| TW | I278507 | 4/2007 |
| WO | WO 02/067309 | 8/2002 |
| WO | WO 2004/107429 | 12/2004 |
| WO | WO 2006/040864 | 4/2006 |

OTHER PUBLICATIONS

"Science of Rare Earth" (Adachi, Ginya, ed., Kagaku-Dojin Publishing Co., Inc., 1999), pp. 304 and 305.
Translation of the International Preliminary Report on Patentability dated Dec. 23, 2010, for International (PCT) Application No. PCT/JP2009/057956, filed Apr. 22, 2009.
Chinese Official Action dated Dec. 12, 2011, for CN Application No. 2009801142670.
Singapore Search Report dated Feb. 27, 2012, for SG Application No. 201007661-0.
Korean Official Action issued Mar. 12, 2012, for KR Application No. 10-2010-7023386.

(Continued)

*Primary Examiner* — Pegah Parvini
(74) *Attorney, Agent, or Firm* — Fitch, Even, Tabin & Flannery

(57) ABSTRACT

Disclosed is a polishing agent comprising: water; tetravalent metal hydroxide particles; and an additive, wherein the additive contains at least one of a cationic polymer and a cationic polysaccharide. The present invention can provide a polishing agent which is capable of polishing an insulating film at a high speed with less polishing flaws, and having a high polishing rate ratio of a silicon oxide film and a stopper film, in the CMP technology of flattening insulating film. The present invention can also provide a polishing agent set for storing the polishing agent, and a method for polishing a substrate using this polishing agent.

18 Claims, 2 Drawing Sheets

(56) References Cited

OTHER PUBLICATIONS

Japanese Official Action issued Aug. 7, 2012, for JP Application No. 2010-509192.
Chinese Official Action issued Aug. 28, 2012, for CN Application No. 2009801142670.
Chinese Official Action issued Mar. 15, 2013, for CN Application No. 2009801142670.
Chinese Official Action issued on Sep. 17, 2013, for CN Application No. 200980114267.0.
Japanese Official Action issued on Oct. 29, 2013, for JP Application No. 2012-223009.
Japanese Official Action issued on Oct. 29, 2013, for JP Application No. 2012-223010.
Japanese Official Action issued on Oct. 29, 2013, for JP Application No. 2012-223011.
Chinese Official Action issued on Dec. 24, 2013, for CN Application No. 201210212508.9.
WIPO International Patent Classification (established 1971) C08L: Compositions of Macromolecular Compounds.
*McGraw-Hill Dictionary of Scientific and Technical Terms*, Fifth Ed., 1996, p. 1859.
I. Mita, *A Guide to Polymer Nomenclature*, vol. 51, 2002, pp. 269-279.
Chinese Official Action issued on Mar. 12, 2014, for CN Application No. 2009801142670.
Chinese Official Action issued on Mar. 28, 2014, for CN Application No. 2013103341183.
Taiwanese Official Action issued on May 22, 2014, for TW Application No. 10320697330.
Chinese Official Action issued on Sep. 2, 2014, for CN Application No. 2012102125089.
Office Action in Taiwanese Patent Appln. No. 098113357, issued Jan. 7, 2015 (4 pgs., in Taiwanese); (English language translation, 2 pgs.).
Office Action in Chinese Patent Appln. No. 2012102125089, issued Feb. 6, 2015 (3 pgs., in Chinese); (English language translation, 2 pgs.).
Chinese Office Action in Application No. 201410406599.9, dated Apr. 20, 2015.
*Abstract of JP 2008124222-2008-05-29.
Translation of Chinese Official Action issued on Apr. 20, 2015, in related Chinese Application No. 2014104065999.
Taiwanese Official Action mailed Jun. 24, 2015, for Taiwanese Application No. 098113357, and English language translation thereof.
Office Action mailed Aug. 17, 2015, for Chinese Application No. 201210212508.9, with English language translation thereof; 8 pages.

* cited by examiner

POLISHING AGENT AND METHOD FOR POLISHING SUBSTRATE USING THE POLISHING AGENT

This application is a Continuation application of application Ser. No. 12/988,898, filed Oct. 21, 2010, now U.S. Pat. No. 8,617,275, the contents of which are incorporated herein by reference in their entirety. Ser. No. 12/988,898 is a National Stage Application, filed under 35 USC 371, of International (PCT) Application No. PCT/JP2009/057956, filed Apr. 22, 2009.

TECHNICAL FIELD

The present invention relates to a polishing agent used in a process for flattening a substrate surface, particularly a process for flattening a shallow trench isolation insulating film, a pre-metal insulating film, an interlayer insulating film or the like, which is a technology for producing semiconductor devices, a polishing agent set for storing the polishing agent, and a method for polishing a substrate using this polishing agent.

BACKGROUND ART

In the recent processes for production of semiconductor devices, the importance of processing technologies for density enhancement and miniaturization is ever increasing. The chemical mechanical polishing (CMP) technology, which is one of such technologies, now serves as a technology essential for the formation of shallow trench isolation, flattening of pre-metal insulating films or interlayer insulating films, and formation of plugs and embedded metal wirings, in the processes for production of semiconductor devices.

In the conventional processes for production of semiconductor devices, fumed silica polishing agents are generally investigated for the flattening of insulating films such as silicon oxide films, which are formed by a method such as a chemical vapor deposition (CVD; chemical layer growth) method or a spin coating method. Fumed silica polishing agents are produced by growing particles by a method of thermally decomposing silicon tetrachloride or the like, and adjusting the pH.

However, such silica polishing agents have a technical problem that the polishing rate is low. In the generation of a design rule of 0.25 μm or less, shallow trench isolation is being used for the isolation of devices within an integrated circuit.

In the shallow trench isolation, CMP is used to eliminate any excess silicon oxide film formed on the substrate, and in order to stop polishing, a stopper film to be polished at slower polishing rate is formed underneath the silicon oxide film. The stopper film is formed using silicon nitride or the like, and it is preferable that the polishing rate ratio between the silicon oxide film and the stopper film is large. Conventional colloidal silica-based polishing agents are such that the polishing rate ratio of the silicon oxide film and the stopper film is as small as about 3, and the polishing agents do not have a characteristic of being durable for the actual use in shallow trench isolation.

On the other hand, cerium oxide polishing agents are being used as glass surface polishing agents for photomasks, lenses and the like. The cerium oxide polishing agents have an advantage that the polishing rate is fast as compared with silica polishing agents or alumina polishing agents.

In recent years, polishing agents for semiconductor using high-purity cerium oxide polishing particles have been put to use. For example, the technology is disclosed in Patent Literature 1. It is also known to add additives in order to control the polishing rate of cerium oxide polishing agents and to enhance overall flatness. For example, this technology is disclosed in Patent Literature 2.

In recent years, further miniaturization is in progress with regard to the processes for production of semiconductor devices, and polishing flaws that occur at the time of polishing have been a problem. In regard to this problem, there has been an attempt to make the average particle size of the cerium oxide particles of such polishing agents using cerium oxide as described above small. However, when the average particle size is made small, the mechanical action is reduced, and therefore, there is a problem that the polishing rate is decreased.

In regard to this problem, a polishing agent using tetravalent metal hydroxide particles is under investigation, and this technology is disclosed in Patent Literature 3. This technology is intended to take advantage of the chemical action of the tetravalent metal hydroxide particles, while reducing the mechanical action as far as possible, and to thereby achieve a balance between the reduction of polishing flaws caused by the particles and the enhancement of polishing rate.

PRIOR ART LITERATURES

Patent Literature

Patent Literature 1: Japanese Patent Application Laid-Open No. 10-106994
Patent Literature 2: Japanese Patent Application Laid-Open No. 08-022970
Patent Literature 3: International Publication Pamphlet No. WO 02/067309

DISCLOSURE OF THE INVENTION

Technical Problem

However, since a higher polishing rate is generally more preferred, a polishing agent which is capable of suppressing the polishing flaws to low levels and performing polishing at a high speed, is demanded. In general, the polishing rate is elevated by increasing the concentration of polishing particles, but at the same time, the potential for increasing the polishing flaws is increased. Therefore, a polishing agent capable of performing polishing at a high speed without increasing the concentration of the polishing particles, is desired.

Furthermore, in the case of a polishing agent for shallow trench isolation, it is requested to increase a polishing rate ratio of silicon oxide and silicon nitride, that is, to obtain a high selection ratio. In this regard, it is described in the Patent Literature 3 that a predetermined selection ratio may be obtained with the polishing agent described therein. However, since the higher the selection ratio, the better the performance, a polishing agent having a higher selection ratio is demanded.

An object of the present invention is to provide a polishing agent which is capable of polishing an insulating film at a high speed with less polishing flaws in the CMP technology for flattening a shallow trench isolation insulating film, a pre-metal insulating film, an interlayer insulating film or the like, and a method for polishing a substrate using this polishing agent.

Another object of the invention is to provide a polishing agent having a high polishing rate ratio between a silicon oxide film and a stopper film, a polishing agent set for storing the polishing agent, and a method for polishing a substrate using this polishing agent.

Still another object of the invention is to provide a polishing agent which is capable of performing polishing at a high speed even though the agent contains polishing particles at low concentrations.

Solution to Problem

The present invention is characterized by providing a polishing agent containing tetravalent metal hydroxide particles, and at least one of a cationic polymer and a cationic polysaccharide, as an additive.

The amino group contained in this additive acts on the tetravalent metal hydroxide particles and/or the film to be polished. At this time, it is speculated that the difference between the interaction of amino group-silicon oxide film and the interaction of amino group-stopper film causes a high polishing rate ratio between a silicon oxide film and a stopper film. That is, the amino group interacts particularly with the silicon oxide film and the stopper film, respectively, and optionally adsorbs; however, there is a difference in the extent of the interactions. For example, although the influence of the amino group on silicon oxide is small, the amino group serves as a protective film for the stopper film and inhibits polishing. For this reason, it is conjectured that consequently there occurs a difference in the polishing rate.

Furthermore, the cationic polymer and the cationic polysaccharide have effects also on the lowering of the concentration of polishing particles. During polishing, cut pieces of a polishing pad are generated, and some of the polishing particles adsorb to the cut pieces, thereby turning into ineffective polishing particles that do not contribute to polishing. When the concentration of the polishing particles is made low, the ineffective polishing particles formed by the adsorption as mentioned above become non-negligible, and thereby the polishing rate is decreased. On the other hand, the cationic polymer or the cationic polysaccharide adsorbs to the cut pieces of a polishing pad and changes the charge at the surface to a positive charge, thereby suppressing the adsorption of the polishing particles. This causes a reduction in the ineffective polishing particles, and a practical polishing rate is obtained even at a low concentration of polishing particles. Thus, it is effective from the viewpoint of the cost and the waste material management.

The present invention relates to the following items (1) to (14).

(1) A polishing agent containing: water; tetravalent metal hydroxide particles; and an additive,
wherein the additive contains at least one of a cationic polymer and a cationic polysaccharide.

(2) A polishing agent containing: water; tetravalent metal hydroxide particles; and an additive,
wherein at least one component of the additive is selected from the group consisting of the following [1] to [6]:

[1] an amino sugar or a polysaccharide having an amino sugar;
[2] an ethyleneimine polymer or a derivative thereof;
[3] an allylamine polymer or a derivative thereof;
[4] a diallylamine polymer or a derivative thereof;
[5] a vinylamine polymer or a derivative thereof; and
[6] a polymer containing at least one kind of monomer component selected from the group of the following formulas (I) to (IV):

[Chemical Formula 1]

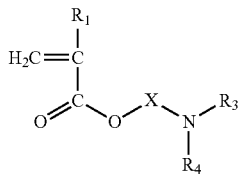
(I)

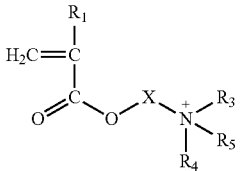
(II)

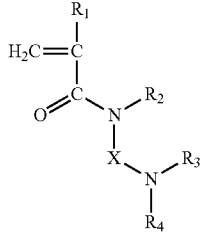
(III)

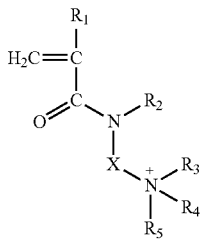
(IV)

wherein in the formulas (I) to (IV), $R_1$ to $R_5$ each independently represent a hydrogen atom or a monovalent organic group; and X represents a divalent organic group.

(3) The polishing agent as set forth in item (1) or (2), wherein the average particle size of the tetravalent metal hydroxide particles is within the range of from 1 nm to 400 nm.

(4) The polishing agent as set forth in any one of items (1) to (3), wherein the pH of the polishing agent is within the range from 3.0 to 7.0.

(5) The polishing agent as set forth in any one of items (1) to (4), wherein the content of the tetravalent metal hydroxide particles is from 0.001 parts by weight to 5 parts by weight relative to 100 parts by weight of the polishing agent.

(6) The polishing agent as set forth in any one of items (1) to (5), wherein the zeta potential of the tetravalent metal hydroxide particles in the polishing agent is +10 mV or higher.

(7) The polishing agent as set forth in any one of items (1) to (6), wherein the content in total of the cationic polymer and the cationic polysaccharide is 0.0001 parts by weight or more relative to 100 parts by weight of the polishing agent.

(8) The polishing agent as set forth in any one of items (1) to (7), wherein the additive is any one of chitosan and derivatives thereof.

(9) The polishing agent as set forth in any one of items (1) to (8), further comprising polyvinyl alcohol.

(10) The polishing agent as set forth in any one of items (1) to (9), which is used for polishing a surface to be polished containing at least silicon oxide at the surface.

(11) The polishing agent as set forth in any one of (1) to (10), wherein the tetravalent metal hydroxide is at least one of rare earth metal hydroxides and zirconium hydroxide.

(12) A method for polishing a substrate, the method comprising the steps of:

applying pressure on a substrate on which a film to be polished is formed by pressing the substrate against a polishing cloth of a polishing platen; and moving the substrate and the polishing platen relatively to each other to polish the film to be polished, while supplying the polishing agent as set forth in any one of items (1) to (11) between the film to be polished and the polishing cloth.

(13) The method for polishing as set forth in item (12), wherein a polishing cloth having a Shore D hardness of 70 or harder is used.

(14) A polishing agent set containing a slurry and an additive liquid, which are stored separately and mixed immediately before polishing or at the time of polishing to be the polishing agent as set forth in any one of items (1) to (11), wherein the slurry contains the tetravalent metal hydroxide particles and the water, and the additive liquid contains the additive and the water.

Effect of the Invention

According to the present invention, it is an object to provide a polishing agent capable of polishing an insulating film at a high speed with less polishing flaws in the CMP technology for flattening a shallow trench isolation insulating film, a pre-metal insulating film, an interlayer insulating film or the like, and a method for polishing a substrate using this polishing agent.

It is another object to provide a polishing agent having a high polishing rate ratio between a silicon oxide film and a stopper film, a polishing agent set for storing the polishing agent, and a method for polishing a substrate using this polishing agent.

BEST MODES FOR CARRYING OUT THE INVENTION

Figure 1:
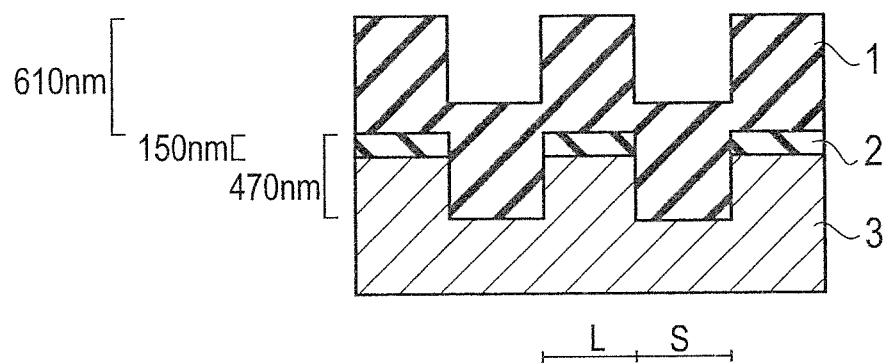
FIG. 1 is a partially magnified cross-sectional view of a wafer for evaluation.

The polishing agent of the present invention is a composition which contains water, tetravalent metal hydroxide particles, and an additive, and is brought into contact with a film to be polished at the time of polishing. Hereinafter, the various components and the components that can be optionally added will be explained in order.

In the polishing agent of the present invention, tetravalent metal hydroxide particles are applied as polishing particles. The tetravalent metal hydroxide particles are preferable from the viewpoint of having high reactivity with silicon dioxide and having a high polishing rate as compared with conventional polishing particles of silica, cerium oxide or the like.

As the tetravalent metal hydroxide particles, it is preferable to use at least one of rare earth metal hydroxides and zirconium hydroxide. Two or more kinds may be selected from rare earth metal hydroxides and zirconium hydroxide and then may be used. As the rare earth metal hydroxide, it is preferable to use cerium hydroxide from the viewpoint that it has a high polishing rate.

As the method for producing the tetravalent metal hydroxide particles, a technique of mixing a tetravalent metal salt and an alkali liquid can be used. This method is described in, for example, "Science of Rare Earth" (Adachi, Ginya, ed., Kagaku-Dojin Publishing Co., Inc., 1999), pp. 304-305.

Preferable examples of the tetravalent metal salt include $M(SO_4)_2$, $M(NH_4)_2(NO_3)_6$, $M(NH_4)_4(SO_4)_4$ (provided that M represents a rare earth element), and $Zr(SO_4)_2 \cdot 4H_2O$. Particularly, chemically active cerium (Ce) is more preferred.

As the alkali liquid, aqueous ammonia, potassium hydroxide or sodium hydroxide can be used. The alkali liquid is preferably aqueous ammonia. In the tetravalent metal hydroxide particles synthesized by the method as described above, metal impurities may be removed by washing. Washing of the metal hydroxide can be carried out by using a method of repeating solid-liquid separation several times by centrifugation or the like.

Since the tetravalent metal hydroxide particles thus obtained are present in an aggregated state, it is preferable to disperse the particles in water by an appropriate method. As the method of dispersing the tetravalent metal hydroxide particles in water which is a main dispersion medium, conventional dispersion treatment using a stirrer, as well as a homogenizer, an ultrasonic dispersing machine, a wet ball mill or the like can be used. In regard to the method of dispersing and the method of controlling the particle size, for example, those methods described in "Encyclopedia of Dispersion Technology" (Johokiko Co., Ltd., July 2005).

The average particle size of the thus-produced tetravalent metal hydroxide particles in the polishing agent is preferably 1 nm or larger, more preferably 2 nm or larger, and even more preferably 10 nm or larger, from the viewpoint of preventing the polishing rate from being excessively decreased. The upper limit is preferably 400 nm or less, more preferably 300 nm or less, and even more preferably 250 nm or less, from the viewpoint that the film to be polished hardly has flaws generated therein.

The specific surface area of the tetravalent metal hydroxide particles in the polishing agent is preferably 100 $m^2/g$ or larger, from the viewpoint of enhancing the chemical action with the film to be polished and thereby improving the polishing rate. The specific surface area of the particles can be measured according to the BET method.

In the present invention, the average particle size of the tetravalent metal hydroxide particles refers to the Z-average size that is obtainable by a cumulant analysis using a dynamic light scattering method. The measurement can be achieved by, for example, using ZETASIZER NANO S (trade name, manufactured by Malvern Instruments, Ltd.). In a more specific example, the tetravalent metal hydroxide particles are diluted with water so that the concentration of the particles would be 0.2 parts by weight, and about 1 mL of the dilution is placed in a cell having 1 cm-square, and is mounted in ZETASIZER NANO S. The refractive index of the dispersion medium is adjusted to 1.33, while the viscosity is adjusted to 0.887, and a measurement is made at 25° C. Thus, the value indicated as the Z-average size is read out.

The concentration of the tetravalent metal hydroxide particles is preferably 0.05 parts by weight or more, and more preferably 0.1 parts by weight or more, relative to 100 parts by weight of the polishing agent, from the viewpoint that a suitable polishing rate can be obtained. Furthermore, from the viewpoint that the storage stability of the polishing agent can be improved, the content is preferably 5 parts by weight or less, more preferably 3 parts by weight or less, and even more preferably 2 parts by weight or less.

The polishing agent according to the present invention contains an additive. The additive as used herein refers to the substance contained in the polishing agent other than the water and the tetravalent metal hydroxide particles in order to regulate the dispersibility of the tetravalent metal hydroxide particles, polishing characteristics, storage stability and the like.

The additive according to the present invention includes at least one of a cationic polymer and a cationic polysaccharide. The cationic polymer and the cationic polysaccharide are compounds each having in the molecule a functional group that turns into a cation, and examples of the functional group that turns into a cation include an amino group, a quaternary ammonium group, and a group obtained by eliminating one hydrogen atom from a nitrogen-containing heterocyclic compound (for example, a pyridine ring, an imidazole ring, or a triazole ring).

Specifically, at least one component is selected from the group consisting of (1) an amino sugar or a polysaccharide having an amino sugar, (2) an ethyleneimine polymer or a derivative thereof, (3) an allylamine polymer or a derivative thereof, (4) a diallylamine polymer or a derivative thereof, (5) a vinylamine polymer or a derivative thereof, (6) a polymer containing at least one of monomer component selected from the group of the following formulas (I) to (IV). These can be used singly or in combination of two or more kinds. The components (1) to (6) will be explained below.

[Chemical Formula 2]

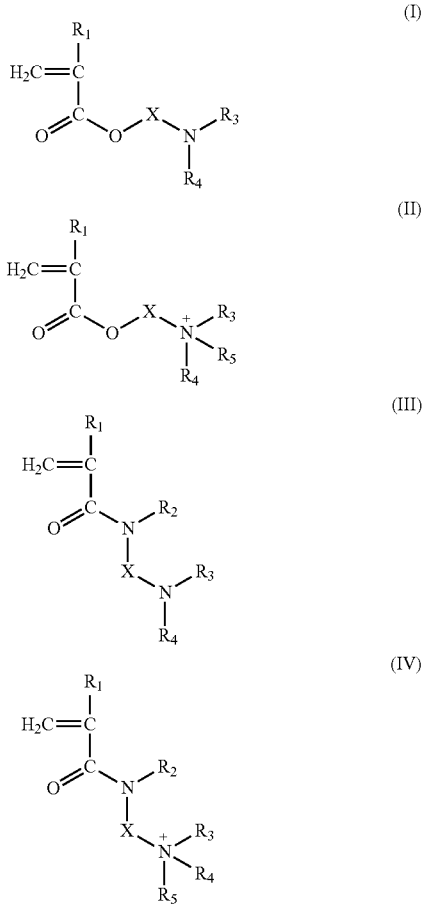

wherein in the formulas (I) to (IV), $R_1$ to $R_5$ each independently represent a hydrogen atom or a monovalent organic group; and X represents a divalent organic group.

(1) Amino sugar or polysaccharide having amino sugar

According to the invention, the amino sugar is a saccharide having an amino group, and examples include glucosamine and galactosamine. Derivatives of these sugars are also acceptable.

Examples of the derivatives include N-acetylglucosamine, glucosamine sulfate, N-carbamoylglucosamine, glucosamine hydrochloride, glucosamine acetate, glucosamine sulfate, and N-acetylgalactosamine.

Furthermore, according to the present invention, the polysaccharide having an amino sugar is a product in which monosaccharides are linked via glycoside linkage, and contains at least one or more of the amino sugar mentioned above. Examples of such a polysaccharide having an amino sugar include chitin, chitosan, glucosamine, chondroitin, hyaluronic acid, keratan sulfate, heparan sulfate, heparin, and dermatan sulfate, and derivatives thereof are also acceptable.

From the viewpoint of the polishing rate and a high polishing rate ratio of a silicon oxide film and a stopper film (hereinafter, also referred to as selection ratio), chitosan and chitosan derivatives are preferable.

Examples of the chitosan derivatives include chitosan pyrrolidone carboxylic acid salts, cationized chitosan, hydroxypropyl chitosan, chitosan lactate, glycerylated chitosan, glycol chitosan, carboxymethylchitosan (CM-chitosan), and carboxymethylchitosan succinamide.

When chitosan is used as the additive, the degree of deacetylation is preferably 20% or greater, more preferably 50% or greater, and most preferably 70% or greater, from the viewpoint of increasing the selection ratio. In addition, the degree of deacetylation of chitosan is a value measured by the colloid titration method described in Society for Chitin and Chitosan, ed., "Manual for Chitin and Chitosan Experiments," published by Gihodo Shuppan Co., Ltd. (1994).

Furthermore, when chitosan is used as the additive, the viscosity of the aqueous chitosan solution is preferably within the range of 1 to 10000 mPa·s, more preferably 1 to 2000 mPa·s, and most preferably 2 to 1000 mPa·s, from the viewpoint of the polishing agent handleability and polishing rate. Here, the viscosity of the aqueous chitosan solution is a value measured for an aqueous solution containing 0.5% of chitosan and 0.5% of acetic acid, by using a B type viscometer at 20° C., and the viscosity is known to be correlated to the molecular weight of chitosan.

The concentration in total of the cationic polymer and the cationic polysaccharide used as the additive is preferably 0.0001 parts by weight or greater, more preferably from 0.0005 parts by weight to 5 parts by weight, and most preferably from 0.001 parts by weight to 0.5 parts by weight, relative to 100 parts by weight of the polishing agent. If the concentration of the additive is too low, the selection ratio tends to decrease, and on the contrary, if the concentration is too high, the polishing rate tends to decrease.

(2) Ethyleneimine polymer or derivative thereof.

According to the present invention, the ethyleneimine polymer is a polymer obtained by polymerizing ethyleneimine, and the polymer may have a linear structure or may have a branched structure. Furthermore, the ethyleneimine polymer has an amino group, and this amino group may be any of primary, secondary, tertiary and quaternary amines, while plural kinds of amino groups may be present in mixture in the molecule.

Furthermore, the ethyleneimine polymer may be used in the form of a derivative by modifying the amino group of the polymer. The method of modification is not particularly limited, but for example, there may be mentioned a method of reacting the amino group with an aldehyde, a ketone, an alkyl halide, an isocyanate, a thioisocyanate, a double bond, an epoxy compound, a cyanamide, a guanidine, a urea, a carboxylic acid, an acid anhydride, an acyl halide, or the like.

The molecular weight of the ethyleneimine polymer or a derivative thereof used as the additive is not particularly limited as long as the polymer or the derivative can be dissolved in water, but the molecular weight as the weight average molecular weight is preferably 100 or greater, more preferably equal to or greater than 300 to less than 1,000,000, and most preferably equal to or greater than 1000 to less than 200,000. If the molecular weight is too small, the polishing rate ratio of a silicon oxide film and a stopper film (hereinafter, referred to as selection ratio) tends to decrease, and if the molecular weight is too large, the viscosity increases so much that handleability tends to decrease.

(3)-(5) Allylamine polymer, diallylamine polymer, vinylamine polymer or derivatives thereof According to the present invention, the allylamine polymer, diallylamine polymer, and vinylamine polymer (hereinafter, these polymers may be collectively referred to as allylamine-based polymers) are polymers obtained by polymerizing allylamine, diallylamine and vinylamine (hereinafter, these compounds may be referred to as allylamine-based monomers), respectively, as one of monomers, and the polymers may be derivatives thereof, or may be copolymers with other monomers. Furthermore, each of these polymers has an amino group, and the amino group may be any primary, secondary, tertiary and quaternary amino groups. The polymers may have plural kinds of amino groups.

In regard to the allylamine-based polymer, when a monomer other than the allylamine-based monomer is used as a monomer component, the other monomer compound is not particularly limited as long as the compound can be polymerized with an allylamine-based monomer, and specific examples include sulfur dioxide, and monomer compounds having carbon-carbon double bonds in the molecule such as maleic acid, fumaric acid, acrylamide and dimethylacrylamide. These can be used singly or a combination of two or more kinds can be used.

Examples of the allylamine polymer include an allylamine polymer, an allylamine hydrochloride polymer, an allylamine amide sulfate polymer, an allylamine hydrochloride-diallylamine hydrochloride copolymer, an allylamine acetate-diallylamine acetate copolymer, an allylamine hydrochloride-dimethylallylamine hydrochloride copolymer, an allylamine-dimethylallylamine copolymer, a partial methoxycarbonylated allylamine polymer, and a partial methylcarbonylated allylamine acetate polymer. These can be used singly or in combination of two or more kinds.

Specific examples of the diallylamine polymer include a diallylamine hydrochloride polymer, a methyldiallylamine hydrochloride polymer, a methyldiallylamine amide sulfate polymer, a methyldiallylamine acetate polymer, a diallyldimethylammonium chloride polymer, a diallylamine hydrochloride-sulfur dioxide copolymer, a diallylamine acetate-sulfur dioxide copolymer, a diallylmethylethylammonium ethylsulfate-sulfur dioxide copolymer, a methyldiallylamine hydrochloride-sulfur dioxide copolymer, a diallyldimethylammonium chloride-sulfur dioxide copolymer, a diallyldimethylammonium chloride-acrylamide copolymer, a partial 3-chloro-2-hydroxypropylated diallylamine hydrochloride-diallyldimethylammonium chloride copolymer, a diallylamine hydrochloride-maleic acid copolymer, a diallylamine amide sulfate-maleic acid copolymer, and a maleic acid-diallyldimethylammonium chloride-sulfur dioxide copolymer. These can be used singly or in combination of two or more kinds.

Specific examples of the vinylamine polymer include a vinylamine copolymer, and a vinyl alcohol-vinylamine copolymer, and these can be used singly or in combination of two or more kinds.

The weight average molecular weight of the allylamine-based polymer used as the additive, is not particularly limited as long as the polymer is soluble in water, but the weight average molecular weight is preferably 100 or greater, more preferably equal to or greater than 300 and less than 1,000,000, and most preferably equal to or greater than 1000 and less than 300,000. If the molecular weight is too small, the polishing rate ratio of a silicon oxide film and a stopper film (hereinafter, referred to as selection ratio) tends to decrease, and if the molecular weight is too large, the viscosity increases so much that handleability tends to decrease.

(6) Polymer containing at least one of monomer component selected from group of following formulas (I) to (IV)

The polymer containing at least one of monomer component selected from the group of formulas (I) to (IV), is a polymer obtained by polymerizing at least one of monomer component selected from the group of the following formulas (I) to (IV), as one of the monomers.

[Chemical Formula 3]

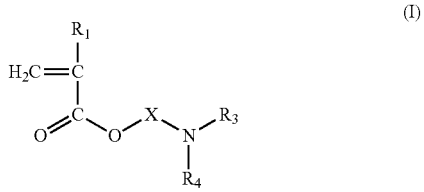

(I)

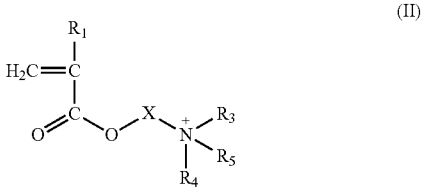

(II)

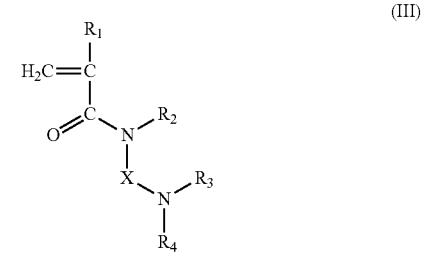

(III)

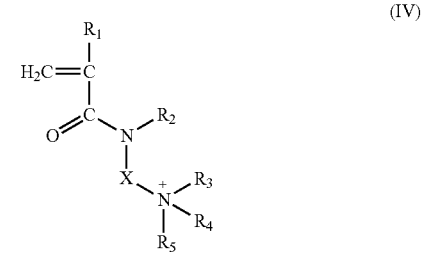

(IV)

wherein in the formulas (I) to (IV), $R_1$ to $R_5$ each independently represent a hydrogen atom or a monovalent organic group; and X represents a divalent organic group.

In the formulas (I) to (IV), the monovalent organic group represented by $R_1$ to $R_5$ is not particularly limited, but specific examples include a hydrogen atom, an alkyl group having 1 to 6 carbon atoms, a phenyl group, a benzyl group, a difluoromethyl group, a trifluoromethyl group, and a cyano group. Those groups may have substituents. Among them, from the viewpoint of availability or solubility in water, the monovalent organic group is preferably a hydrogen atom or an alkyl group having 1 to 6 carbon atoms, and more preferably a hydrogen atom or a methyl group.

In the formulas (I) to (IV), specifically, the divalent organic group represented by X is not particularly limited, but specific examples include an alkylene group having 1 to 6 carbon atoms and a phenylene group. These groups may have substituents. Among them, the alkylene group having 1 to 3 carbon atoms is more preferred from the viewpoint of availability or solubility in water.

The polymer containing a cationic monomer component used in the present invention can be produced by various synthesis methods known to those having ordinary skill in the art. For example, a method of radical polymerizing the carbon-carbon double bond moiety of the cationic monomer component, or the like can be used.

Furthermore, according to the present invention, polymers (homopolymers) or copolymers (copolymers) produced by polymerizing the monomer components of formulas (I) to (IV) only may be used as the additive, and other copolymers (copolymers) polymerized with monomer components other than the monomers of formulas (I) to (IV) may also be used.

In the case of using the other copolymer, the monomer component that is used together with the monomer component of the formulas (I) to (IV) is not particularly limited as long as the monomer component is water-soluble, but a nonionic monomer component or an anionic monomer component can be used. From the viewpoint of the storage stability of the polishing agent, a nonionic monomer component is preferred.

In the case of using a polymer (homopolymer) or copolymer formed from the monomer components of the formulas (I) to (IV) only, the amount of use of the polymer (homopolymer) or copolymer is preferably 0.0001 parts by weight or greater, more preferably from 0.00052 parts by weight to 5 parts by weight, and most preferably from 0.0051 parts by weight to 0.52 parts by weight. If the concentration of the additive is too low, the selection ratio tends to decrease, and if the concentration is too high, the polishing rate tends to decrease.

In the case of using the other copolymer (copolymer) of the monomer components of the formulas (I) to (IV) with other monomer components, the amount of use of the copolymer is preferably 0.0001 parts by weight or greater, more preferably from 0.00052 parts by weight to parts by weight, and most preferably from 0.0051 parts by weight to 0.52 parts by weight, relative to 100 parts by weight of the polishing agent.

The cationic polymer and the cationic polysaccharide also have an effect of enhancing the stability of the polishing agent. Particularly, chitosan suppresses aggregation as the hydroxyl group interacts with the polishing particles, and can enhance the stability of the polishing agent by suppressing the changes in the particle size of the polishing agent, and therefore, chitosan is particularly preferable.

According to the present invention, in the cationic polymer and the cationic polysaccharide used as the additive, $-NR_2$ or $-N^+R_3$ (wherein R represents a hydrogen atom or a monovalent organic group) carried in the molecule interacts with a silicon oxide film or a stopper film (for example, silicon nitride), but the extent of interaction varies. Due to this difference, the cationic polymer and the cationic polysaccharide can bring about a high selection ratio.

Therefore, it is important that the cationic polymer and the cationic polysaccharide has a $-NR_2$ or $-N^+R_3$ structure. Furthermore, particularly in the case of the polysaccharide, the difference in the interaction can be made large, and thus the selection can be increased, which is more preferable.

The weight average molecular weight of the polymer containing a cationic monomer component that is used as the additive, is not particularly limited as long as the polymer is soluble in water, but the weight average molecular weight is preferably 100 or greater, more preferably equal to or greater than 300 and less than 1,000,000, and most preferably equal to or greater than 1000 and less than 300,000. When the weight average molecular weight is 100 or greater, the selection ratio tends to be sufficiently high, and when the weight average molecular weight is less than 1,000,000, the viscosity is appropriate, and handleability tends to be facilitated.

The polishing agent according to the invention may further contain another additive (hereinafter, also referred to as second additive) in addition to the cationic polymer and the cationic polysaccharide. Examples of these additives include a carboxylic acid, an amino acid, an amphoteric surfactant, an anionic surfactant, a nonionic surfactant, and a cationic surfactant, and these can be used singly or in combination of two or more kinds. Among them, a carboxylic acid, an amino acid and an amphoteric surfactant are preferred from the viewpoint of the dispersibility and polishing rate.

The carboxylic acid has an effect of stabilizing the pH, and specific examples thereof include formic acid, acetic acid, propionic acid, butyric acid, valeric acid, caproic acid and lactic acid.

The amino acid has an effect of enhancing the dispersibility of the tetravalent metal hydroxide particles, and enhancing the polishing rate, and specific examples include arginine, lysine, aspartic acid, glutamic acid, asparagine, glutamine, histidine, proline, tyrosine, tryptophan, serine, threonine, glycine, alanine, β-alanine, methionine, cysteine, phenylalanine, leucine, valine and isoleucine.

The amphoteric surfactant also has an effect of enhancing the dispersibility of the tetravalent metal hydroxide particles and enhancing the polishing rate, and specific examples include betaine, β-alanine betaine, lauryl betaine, stearyl betaine, lauryldimethylamine oxide, 2-alkyl-N-carboxymethyl-N-hydroxyethylimidazolinium betaine, lauric acid amide propyl betaine, palm oil fatty acid amide propyl betaine, and lauryl hydroxylsulfobetaine. Among them, from the viewpoint of enhancing the dispersibility and stability, betaine, β-alasnine betaine, lauric acid amide propyl betaine are more preferred.

The anionic surfactant has an effect of regulating the flatness or in-plane uniformity of the polishing properties, and examples thereof include triethanolamine lauryl sulfate, ammonium lauryl sulfate, triethanolamine polyoxyethylene alkyl ether sulfate, and special polycarboxylic acid type polymeric dispersants.

The nonionic surfactant has an effect of regulating the flatness or in-plane uniformity of the polishing properties, and examples thereof include polyoxyethylene lauryl ether, polyoxyethylene cetyl ether, polyoxyethylene stearyl ether, polyoxyethylene oleyl ether, polyoxyethylene higher alcohol ether, polyoxyethylene octyl phenyl ether, polyoxyethylene nonyl phenyl ether, polyoxyalkylene alkyl ether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, tetraoleic acid polyoxyethylene sorbite, polyethylene glycol monolaurate, polyethylene glycol monostearate, polyethylene glycol distearate, polyethylene glycol monooleate, polyoxyethylene alkyl amine, polyoxyethylene hardened castor oil, 2-hydroxyethyl methacrylate, and alkyl alkanolamide.

The cationic surfactant has an effect of regulating the flatness or in-plane uniformity of the polishing properties, and examples thereof include coconut amine acetate and stearyl amine acetate.

The amount of addition of these second additives is preferably within the range of from 0.01 parts by weight to 10 parts by weight, relative to 100 parts by weight of the polishing agent. When the amount of addition is 10 parts by weight or less, precipitation tends to be reduced.

Among these additives, an amphoteric surfactant is preferred from the viewpoint of enhancing dispersibility and stability, and betaine, β-alanine betaine, lauric acid amide propyl betaine are more preferred.

Furthermore, the polishing agent of the present invention may contain another water-soluble polymer for the purpose of regulating the flatness or in-plane uniformity of the polishing properties. Here, in regard to the term water-soluble, if a compound dissolves in an amount of 0.1 g or more in 100 g of water, the compound is said to be water-soluble. Specific examples of the other water-soluble polymer are not particularly limited, and examples thereof include polysaccharides such as alginic acid, pectinic acid, carboxymethyl cellulose, agar, cardlan and pullulan;

polycarboxylic acids and salts thereof such as polyaspartic acid, polyglutamic acid, polylysine, polymalic acid, polyamide acid, polymaleic acid, polyitaconic acid, polyfumaric acid, poly(p-styrenecarboxylic acid), polyamide acid ammonium salts, polyamide acid sodium salts, and polyglyoxylic acid;

vinyl polymers such as polyvinyl alcohol, polyvinylpyrrolidone and polyacrolein;

acrylic polymers such as polyacrylamide and polydimethylacrylamide;

polyethylene glycol, polyoxypropylene, polyoxyethylene-polyoxypropylene condensate, and a polyoxyethylene-polyoxypropylene block polymer of ethylenediamine. Furthermore, polyvinyl alcohol is particularly preferred since it can enhance flatness.

The weight average molecular weight of these water-soluble polymers is preferably 500 or greater, in view of obtaining an effect of regulating the polishing properties. The amount of incorporation of these water-soluble polymers is preferably 0.01 parts by weight or greater relative to 100 parts by weight of the polishing agent. Furthermore, as for the amount of addition, it is preferable to add the polymers in an amount in the range of 5 parts by weight or less. When the amount of addition is 5 parts by weight or less, the aggregation and precipitation of particles can be avoided irrespective of the size of the particles.

The polishing agent according to the present invention is obtained by, for example, mixing the tetravalent metal hydroxide particles having the characteristics described above with the additive, which is the cationic polymer and/or the cationic polysaccharide, and the water to disperse the particles, and if necessary, further adding the second additive or the water-soluble polymer.

The molecular weight of the polysaccharide or the polymer can be measured by using a static light scattering method. The measurement according to the present invention is carried out such that the amounts of scattered light of samples having different concentrations are measured using ZETASIZER NANO S (trade name, manufactured by Malvern Instruments, Ltd.), and a Debye plot is obtained to determine the molecular weight. At this time, the refractive index increment as a function of concentration (dn/dC) is measured using a differential refractometer (trade name: DRM-3000, manufactured by Otsuka Electronics Co., Ltd.). In addition, all of the measurements are carried out at 25° C., using water as a solvent.

Specifically, for example, the polysaccharide or the polymer is dissolved to obtain a concentration of 0.01 mg/mL to 5 mg/mL, and the solution is filtered through a filter having a pore size of 0.2 μm. Thus, four or more sample solutions having different concentrations are prepared. First, as a standard substance, about 1 mL of filtered toluene is placed in a quartz cell with 1 cm-square, the quartz cell is set in the sample chamber of the ZETASIZER NANO S, and the amount of scattered light is measured. Water is subjected to the measurement by the same method, and the amount of scattered light of the solvent is measured. Subsequently, the sample solutions are sequentially subjected to the same measurement, and the amounts of scattered light of the sample solutions are measured.

Meanwhile, 5 mL of water is injected into the sample injection unit of the differential refractometer, DRM-3000. After allowing the refractometer to stand for about 5 minutes, the refractometer is subjected to zero point calibration, and measurement is performed for one minute. Subsequently, 3 mL of the sample solutions is injected into the refractometer, which is then left to stand for about 5 minutes, and then measurement is performed. The refractive index is plotted against the concentration, and the value indicated as dn/dC is read out.

After a series of measurements, the value obtained by the measurements is selected for dn/dC, while "Small Molecule" is selected for "Shape Correction Model" in the software program of the ZETASIZER NANO S, and thus a Debye plot is generated. Thus, the value indicated as "Molecular Weight" is read out.

The pH of the polishing agent of the present invention is preferably in the range of from 3.0 to 7.0, from the viewpoint that the polishing agent acquires excellent storage stability and polishing rate. The lower limit of the pH mainly affects the polishing rate, and is more preferably 3.0 or higher, and even more preferably 4.0 or higher. The upper limit mainly affects the storage stability, and is preferably 7.5 or lower, and even more preferably 7.0 or lower.

The pH can be regulated by adding an acid component, or an alkali component such as ammonia, sodium hydroxide, tetramethylammonium hydroxide (TMAH) or imidazole. Furthermore, in order to stabilize the pH, a buffer solution may be added. Examples of such a buffer solution include an acetate buffer solution and a phthalate buffer solution.

The pH of the polishing agent of the present invention is measured with a pH meter (for example, Model pH81, manufactured by Yokogawa Electric Corp.). A phthalate pH buffer solution (pH 4.01) and a neutral phosphate pH buffer solution (pH 6.86) are used as standard buffer solutions, and the pH meter is subjected to two-point calibration. Then, the electrode of the pH meter is placed in the polishing agent, and after a lapse of 2 minutes or longer, the value after stabilization is measured. At this time, the liquid temperatures of the standard buffer solutions and the polishing agent are all set at 25° C.

As a method of evaluating dispersibility of the polishing agent, according to the present invention, the zeta potential of the particles in the polishing agent can be used. In the measurement of zeta potential, for example, ZETASIZER 3000HS (trade name, manufactured by Malvern Instruments, Inc.) can be used, and for example, the measurement can be performed by diluting the polishing agent with water so as to obtain an amount of scattered light that is recommended by ZETASIZER 3000HS. In order to obtain satisfactory dispersibility, the zeta potential of the particles is preferably such that the particles are positively charged at a zeta potential of +10 mV or greater, and more specifically, the zeta potential is preferably in the range of +10 to +70 mV.

The polishing agent of the present invention may be stored as a two-liquid type polishing agent set in which a tetravalent metal hydroxide slurry containing at least the tetravalent metal hydroxide particles and the water, and an additive liquid containing at least the additive and the water are maintained separately, or may be stored as a one-liquid type polishing agent containing the tetravalent metal hydroxide particles, the additive and the water. The polishing set is mixed immediately before polishing or at the time of polishing to be used as a polishing agent.

Furthermore, even under any circumstances, the polishing agent may be stored as a concentrated tetravalent metal hydroxide slurry, a concentrated additive liquid, or a concentrated polishing agent, having the content of water reduced, and may be used after being diluted with water at the time of polishing.

When the polishing agent is stored as a two-liquid type polishing agent divided into the tetravalent metal hydroxide slurry and the additive liquid, adjustment of the polishing rate can be made possible by arbitrarily changing composition of these two liquids. In the case of performing polishing with the two-liquid type polishing agent, as the method of supplying the polishing agent onto a polishing platen, there can be used, for example, a method of transporting the tetravalent metal hydroxide slurry and the additive liquid through separate pipes, joining these pipes, mixing the liquids, and supplying the mixture; a method of transporting the concentrated tetravalent metal hydroxide slurry, the concentrated additive liquid and the water through separate pipes, joining these pipes, mixing the liquids, and supplying the mixture; a method of having the tetravalent metal hydroxide slurry and the additive liquid mixed in advance, and supplying the mixed polishing agent; and a method of having the concentrated tetravalent metal hydroxide slurry, the concentrated additive liquid and the water mixed in advance, and supplying the mixed polishing agent.

In the case of a one-liquid type polishing agent containing the tetravalent metal hydroxide particles, the additive and the water, as the method of supplying the polishing agent onto a polishing platen, there can be used, for example, a method of supplying the polishing agent by directly transporting the polishing agent; a method of transporting the concentrated polishing agent and the water through separate pipes, joining these pipes, mixing the liquids, and supplying the mixture; and a method of having the concentrated polishing agent and the water mixed in advance, and supplying the mixture.

The polishing method of the present invention is characterized in that pressure is applied to a substrate having a film to be polished, by pressing the substrate against the polishing cloth of a polishing platen, and while supplying the polishing agent of the present invention between the film to be polished and the polishing cloth, the substrate and the polishing platen are moved relatively to each other to polish the film to be polished.

The substrate may be a substrate associated with the production of semiconductor devices, for example, a substrate in which an insulating film is formed on a semiconductor substrate having a shallow trench isolation pattern, a gate pattern, a wiring pattern or the like formed thereon. Furthermore, the film to be polished may be an insulating film formed on such a pattern, for example, a silicon oxide film or a silicon nitride film.

When the silicon oxide film or silicon nitride film formed on such a semiconductor substrate is polished with the polishing agent, the surface unevenness of the silicon oxide film layer is removed, and a smooth surface can be provided over the entire surface of the semiconductor substrate. As such, the polishing agent of the present invention is preferably used for polishing a film to be polished containing at least silicon oxide at the surface.

The polishing agent of the present invention can also be suitably used for shallow trench isolation. In order to be used for shallow trench isolation, a polishing agent having a selection ratio of 10 or higher is preferred. If the selection ratio is less than 10, the difference between polishing rate for the silicon oxide film and that for the stopper film is small, and when shallow trench isolation is performed, it is difficult to stop polishing at a predetermined position. When the selection ratio is 10 or higher, stopping of polishing becomes easy, and the polishing agent is more suitable for shallow trench isolation.

In order to be used for shallow trench isolation, a polishing agent having less generation of flaws at the time of polishing is preferred. As the stopper film, for example, silicon nitride and polysilicon can be used.

The polishing agent can also be used for polishing a pre-metal insulating film. As the pre-metal insulating film, for example, phosphorus-silicate glass or boron-phosphorus-silicate glass is used in addition to silicon oxide, and silicon oxyfluoride, amorphous carbon fluoride and the like can also be used.

Hereinafter, the polishing method will be explained by taking the case of a semiconductor substrate having an insulating film formed thereon, as an example.

In the polishing method of the present invention, as the apparatus performing polishing, a general polishing apparatus having a holder that can retain a substrate having a film to be polished, such as a semiconductor substrate, and a polishing platen that can be adhered with a polishing cloth (hereinafter, also referred to as polishing pad or pad), can be used.

The substrate holder and the polishing platen are respectively equipped with a motor capable of varying the speed of rotation. For example, a polishing apparatus: model number EPO-111 manufactured by Ebara Corp. can be used.

As the polishing cloth, a non-woven cloth, an expansion product, a non-expansion product or the like can be generally used, and examples of the material that can be used include resins such as polyurethane, acrylic resins, polyesters, acrylic-ester copolymers, polytetrafluoroethylene, polypropylene, polyethylene, poly-4-methylpentene, cellulose, cellulose esters, polyamides such as nylon and aramid, polyimide, polyimideamide, polysiloxane copolymers, oxirane compound, phenolic resins, polystyrene, polycarbonate and epoxy resins. Particularly, from the viewpoint of the polishing rate or flatness, expanded polyurethane and non-expanded polyurethane are preferred.

The Shore D hardness of the polishing cloth is preferably 70 or harder, more preferably 75 or harder, and particularly preferably 80 or harder, from the viewpoint of enhancing flatness. The Shore D hardness can be measured with a Shore D hardness meter (for example, ASKER HARDNESS METER TYPE D (manufactured by Kobunshi Keiki Co., Ltd.)).

Furthermore, the polishing cloth is preferably subjected to groove processing so that the polishing agent accumulates. There is no limitation on the polishing conditions, but the speed of rotation of the platen is preferably 200 min$^{-1}$ or less so as to prevent flying out of the semiconductor substrate, and the pressure (processing load) applied to the semiconductor substrate is preferably 100 kPa or less so as to prevent the occurrence of polishing flaws. While polishing is performed, the polishing agent is continuously supplied to the polishing cloth by a pump or the like. There is no limit on this amount of supply, but it is preferable that the surface of the polishing cloth is covered with the polishing agent all the time.

After polishing is completed, it is preferable to wash the semiconductor substrate thoroughly under running water so as to remove particles adhering to the substrate. Washing may be performed using dilute hydrofluoric acid or aqueous ammonia together, in addition to pure water, and brushing may be performed as well in order to increase the washing efficiency. Furthermore, after washing, it is preferable to dry the semiconductor substrate by knocking off water droplets that are adhering to the semiconductor substrate and then using a spin dryer or the like.

Examples of the method for producing an insulating film where the polishing agent of the present invention is used, include CVD methods which are represented by a low pressure CVD method, a quasi-normal pressure CVD method, a plasma CVD method or the like, and a spin coating method of applying a liquid raw material on a rotating substrate.

A silicon oxide film according to the low pressure CVD method is obtained by, for example, thermally reacting monosilane ($SiH_4$) with oxygen ($O_2$). A silicon nitride film according to the low pressure CVD method is obtained by, for example, thermally reacting dichlorosilane ($SiH_2Cl_2$) with ammonia ($NH_3$).

A silicon oxide film according to the quasi-normal pressure CVD method is obtained by, for example, thermally reacting tetraethoxysilane ($Si(OC_2H_5)_4$) with ozone ($O_3$). A silicon oxide film according to the plasma CVD method is obtained by, for example, subjecting monosilane and nitrogen dioxide ($N_2O$) to a plasma reaction.

As another example, even when tetraethoxysilane and oxygen are subjected to a plasma reaction, a silicon oxide film is similarly obtained.

A silicon nitride film according to the plasma CVD method is obtained by, for example, subjecting monosilane, ammonia and nitrogen ($N_2$) to a plasma reaction.

A silicon oxide film according to the spin coating method is obtained by, for example, applying a liquid raw material containing inorganic polysilazane, inorganic siloxane or the like on a substrate, and subjecting the liquid raw material to a thermosetting reaction using a furnace or the like.

In order to stabilize the film quality of the insulating film obtained by the method as described above, such as a silicon oxide film or a silicon nitride film, the insulating film may be heat treated if necessary, at a temperature of 200° C. to 1000° C.

The silicon oxide film obtained by the method as described above may contain trace amounts of boron (B), phosphorus (P), carbon (C) and the like in order to increase embedding properties.

The polishing agent and the polishing method of the present invention can be applied to a film other than an insulating film such as a silicon oxide film or a silicon nitride film. For example, a high dielectric constant film of Hf-based oxide, Ti-based oxide or Ta-based oxide; a semiconductor film of silicon, amorphous silicon, polysilicon, SiC, SiGe, Ge, GaN, GaP, GaAs, or an organic semiconductor; a phase change film of GeSbTe or the like; an inorganic conductive film of ITO or the like; and a polymer resin film of polyimide, polybenzoxazole, acrylic, epoxy or phenol.

The polishing agent and the polishing method of the present invention can also be applied not only to film-like materials, but also to various substrate materials such as glass, silicon, SiC, SiGe, Ge, GaN, GaP, GaAs, sapphire and plastics.

Furthermore, the polishing agent and polishing method of the present invention can be used not only for the production of semiconductor devices, but also for the production of image display apparatuses such as TFT's and organic EL's; optical components such as photomasks, lenses, prisms, optical fibers and monocrystalline scintillators; optical devices such as photoswitching devices and optical waveguides; light emitting devices such as solid lasers and blue laser LED's; and magnetic memory apparatuses such as magnetic disks and magnetic heads.

EXAMPLES

Synthesis of Cerium Hydroxide Particles and Preparation of Concentrated Cerium Hydroxide Slurry 430 g of $Ce(NH_4)_2(NO_3)_6$ was dissolved in 7300 g of pure water, and then this solution was mixed under stirring with 240 g of aqueous ammonia (25% aqueous solution). Thus, 160 g of cerium hydroxide (yellow white color) was obtained.

The cerium hydroxide thus obtained was subjected to solid-liquid separation by centrifugation (1000 G, for 5 minutes). The liquid was removed, pure water was further added thereto, and centrifugation was performed again under the conditions described above. Such an operation was repeated four times, and washing was performed. The specific surface area of the cerium hydroxide particles thus obtained was measured according to the BET method, which was found to be 200 m$^2$/g.

10 g of the obtained cerium hydroxide particles and 990 g of water were mixed, and the mixture was dispersed using an ultrasonic washing machine. Thus, a concentrated cerium hydroxide slurry (cerium hydroxide concentration 1% by weight) was prepared.

This concentrated cerium hydroxide slurry was diluted with water, and the average particle size (Z-average size) was measured by using ZETASIZER NANO S (trade name, manufactured by Malvern Instruments, Inc.), which was found to be 100 nm.

Furthermore, in order to measure the zeta potential of the particles in the polishing agent, the polishing agent was diluted with water to an appropriate concentration, and then the zeta potential was measured by using ZETASIZER 3000HS (trade name, manufactured by Malvern Instruments, Inc.), which was found to be +43 mV. The measurement was carried out at 25° C.

Example 1

A concentrated additive liquid containing 1% by weight of chitosan 500 (manufactured by Wako Pure Chemical Industries, Ltd.; viscosity in the case of dissolving chitosan at a proportion of 0.5% in a 0.5% aqueous solution of acetic acid: 500 mPa·s), 0.3% by weight of acetic acid and 98.7% by weight of water, was prepared. 10 g of this concentrated additive liquid, 100 g of the concentrated cerium hydroxide slurry obtained as described above, and 390 g of water were mixed, and a 5 wt % aqueous solution of imidazole was added thereto until the pH reached 5.6. Thus, a polishing agent was prepared.

The average particle size was 100 nm, and the zeta potential was +44 mV. The average particle size and the zeta potential were measured as described above.

Example 2

A concentrated additive liquid containing 1% by weight of chitosan 50 (manufactured by Wako Pure Chemical Industries, Ltd.; viscosity of an aqueous solution containing 0.5% chitosan and 0.5% acetic acid: 50 mPa·s), 0.3% by weight of acetic acid and 98.7% by weight of water, was prepared. 10 g of this concentrated additive liquid, 100 g of the concentrated cerium hydroxide slurry obtained as described above, and 390 g of water were mixed, and a 5 wt % aqueous solution of imidazole was added thereto until the pH reached 5.6. Thus, a polishing agent was prepared.

Example 3

A concentrated additive liquid containing 1% by weight of chitosan 5 (manufactured by Wako Pure Chemical Industries, Ltd.; viscosity of an aqueous solution containing 0.5% chitosan and 0.5% acetic acid: 5 mPa·s), 0.3% by weight of acetic acid and 98.7% by weight of water, was prepared. 10 g of this concentrated additive liquid, 100 g of the concentrated cerium hydroxide slurry obtained as described above, and 390 g of water were mixed, and a 5 wt % aqueous solution of imidazole was added thereto until the pH reached 5.6. Thus, a polishing agent was prepared.

Comparative Example 1

100 g of the concentrated cerium hydroxide slurry and 400 g of water were mixed, and a 5 wt % aqueous solution of imidazole was added thereto until a predetermined pH was reached. Thus, a polishing agent was prepared.

Comparative Example 2

1 kg of cerium oxide particles, 23 g of a commercially available aqueous solution of polyacrylic acid ammonium salt (40% by weight), and 8977 g of deionized water were mixed, and the mixture was ultrasonically dispersed while the mixture was stirred. The dispersion was filtered through a 1-micrometer filter, deionized water was further added thereto, and thereby a concentrated cerium oxide slurry containing 5% by weight of cerium oxide was obtained. 100 g of the concentrated cerium oxide slurry described above and 900 g of water were mixed, and 1 N nitric acid was added thereto until the pH reached 4. Thus, a polishing agent (solids content: 0.5% by weight) was prepared.

The pH, average particle size and zeta potential of the respective polishing agents of Examples 2 and 3 and Comparative Examples 1 and 2 were measured in the same manner as in Example 1.

(Polishing of Insulating Film)

A wafer for evaluation having a silicon oxide ($SiO_2$) film having a thickness of 1000 nm formed over the entire surface of a silicon (Si) substrate having a diameter of 200 mm, was fixed onto a substrate holder of a polishing apparatus (model number: EPO-111, manufactured by Ebara Corp.). Meanwhile, a polishing pad made of a porous urethane resin, IC-1000 (product number, manufactured by Rodel-Nitta Company; groove shape: perforate) was attached to a polishing platen having a diameter of 600 mm.

The substrate holder was pressed against the polishing pad so that the silicon oxide film would be brought into contact with the pad, and the processing load was set at 30 kPa. While the polishing agent prepared as described above was dropped onto the polishing pad at a rate of 200 mL/min, the platen and the substrate holder were respectively operated at 50 $min^{-1}$, and thus the wafer for evaluation was polished for 60 seconds.

The wafer for evaluation after polishing was thoroughly washed with pure water, and was dried. Thereafter, the residual thickness of silicon oxide was measured by using an optical interference type film thickness analyzer (trade name: Nanospec AFT-5100, manufactured by Nanometrics, Inc.). Here, polishing rate for the silicon oxide per minute (RR($SiO_2$)) was determined from the formula: (amount of reduction of silicon oxide film)/(polishing time).

A silicon nitride (SiN) film having a thickness of 200 nm was formed over the entire surface of a silicon (Si) substrate having a diameter of 200 mm, and polishing was performed for 60 seconds by the same method. The residual film thickness of silicon nitride was measured, and thus polishing rate for the silicon nitride per minute (RR(SiN)) was determined. The selection ratio was calculated by the formula: RR($SiO_2$)/RR(SiN).

Furthermore, a silicon oxide ($SiO_2$) film having a thickness of 1000 nm was formed over the entire surface of a silicon (Si) substrate having a diameter of 200 mm, and polishing was performed for 60 seconds by the same method. The wafer after polishing was thoroughly washed with pure water, hydrofluoric acid and aqueous ammonia, and then was dried. The number of polishing flaws was counted with a scanning electron microscope type defect analyzer. The relative number of polishing flaws was calculated by defining the number of polishing flaws of Comparative Example 2 as 1.

The results of the respective Examples and respective Comparative Examples described above are summarized in Table 1.

TABLE 1

| Item | Composition of polishing agent | | pH | Average particle size (nm) | Zeta potential (mV) | Polishing rate for the silicon oxide (nm/min) | Polishing rate for the silicon nitride (nm/min) | Selection ratio | Relative number of polishing flaws |
|---|---|---|---|---|---|---|---|---|---|
| | Polishing particles and concentration (wt %) | Additive and concentration (wt %) | | | | | | | |
| Example 1 | Cerium hydroxide 0.2 | Chitosan 500 0.02 | 5.62 | 100 | +44 | 361 | 18 | 20 | 0.2 |
| Example 2 | Cerium hydroxide 0.2 | Chitosan 50 0.02 | 5.65 | 100 | +42 | 323 | 29 | 11 | 0.3 |
| Example 3 | Cerium hydroxide 0.2 | Chitosan 5 0.02 | 5.60 | 100 | +43 | 234 | 19 | 12 | 0.3 |

TABLE 1-continued

| Item | Composition of polishing agent | | pH | Average particle size (nm) | Zeta potential (mV) | Polishing rate for the silicon oxide (nm/min) | Polishing rate for the silicon nitride (nm/min) | Selection ratio | Relative number of polishing flaws |
|---|---|---|---|---|---|---|---|---|---|
| | Polishing particles and concentration (wt %) | Additive and concentration (wt %) | | | | | | | |
| Comparative Example 1 | Cerium hydroxide 0.2 | — | 5.76 | 100 | +44 | 305 | 120 | 3 | 0.3 |
| Comparative Example 2 | Cerium oxide 0.5 | Polyacrylic acid ammonium salt 0.005 | 4.15 | 120 | −54 | 218 | 46 | 5 | 1 |

As shown in Table 1, it is clear that when the polishing agent of the present invention is used, reduction of the polishing flaws and enhancement of the selection ratio are brought about.

(Wafer for Flatness Evaluation)

Figure 2:
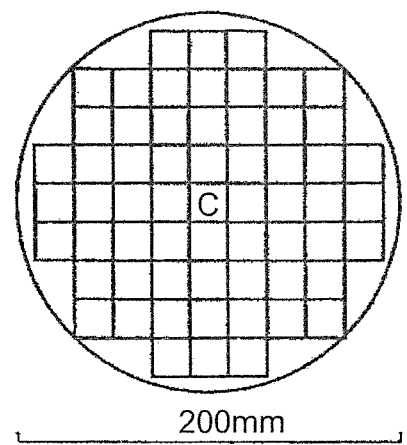
FIG. 2 is a top view of a wafer for evaluation.
Figure 3:
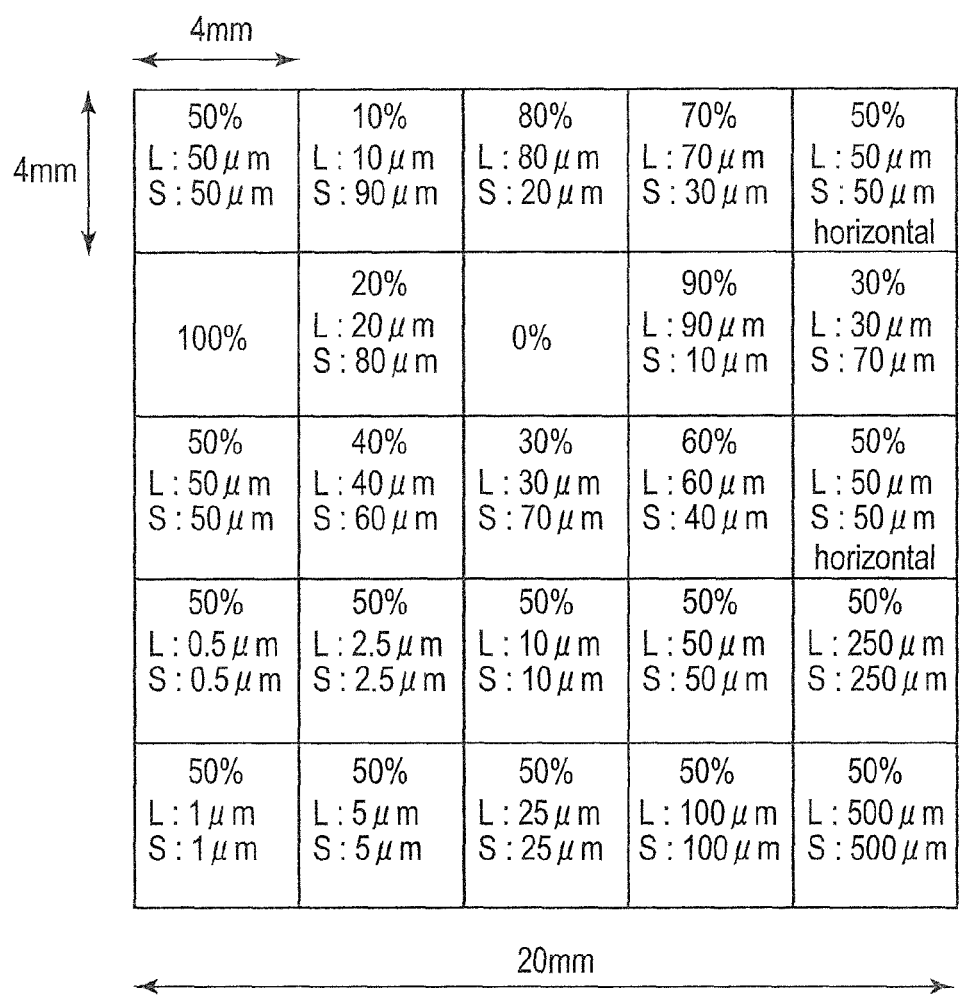
FIG. 3 is a partially magnified view showing the distribution of the surface unevenness of FIG. 2.

In the evaluation of the polishing properties of a patterned wafer, a commercially available wafer for CMP property evaluation (trade name: SEMATECH 864, diameter 200 mm) was used. FIG. 1 is a partially magnified cross-sectional view of the wafer for evaluation; FIG. 2 is a top view of a wafer for evaluation; and FIG. 3 is a partially magnified view showing the distribution of the surface unevenness of FIG. 2. This wafer for evaluation is produced by forming a silicon nitride (SiN) film 2 having a thickness of 150 nm on a silicon substrate 3 by a CVD method, subsequently forming grooves having a depth of 470 nm (320 nm+150 nm), and further forming a silicon oxide ($SiO_2$) film 1 having a thickness of 610 nm by HDP-CVD (high density plasma chemical vapor deposition method).

The grooves and $SiO_2$ were formed into the following patterns. That is, as shown in FIG. 2, the wafer surface is partitioned into 61 regions (20 mm×20 mm), and each region is further partitioned into 25 sub-regions (4 mm×4 mm) (FIG. 3). The respective sub-regions, except two sites, have striated concavo-convex patterns formed therein. Each of the numerical values of 0 to 100% in FIG. 3 shows the proportion of the total area of convex portions seen when the sub-region is planarly viewed, occupying within the sub-region (convex portion areal density). 0% means that the entirety is composed of concave portions, while 100% means that the entirety is composed of convex portions, and striated patterns are not formed. Furthermore, in regard to the values of L and S in FIG. 1 and FIG. 3, L represents the line width of the convex portion, and S represents the line width of the concave portion. Furthermore, the region indicated as C (hereinafter, referred to as center) in FIG. 2 is a region where measurement of the film thickness or of the difference in level was carried out as will be described later.

(Film Thickness Measurement)

In the film thickness measurement, measurements were made for the $SiO_2$ residual film thicknesses at the convex portion and the concave portion in a pattern of L=500 μm and S=500 μm (hereinafter, referred to as 500/500), a pattern of L=100 μm and S=100 μm (hereinafter, referred to as 100/100), and a pattern of L=25 μm and S=25 μm (hereinafter, referred to as 25/25) of the center, respectively, by using an optical inference type film thickness analyzer (trade name: Nanospec AFT-5100, manufactured by Nanometrics, Inc.). Furthermore, in the convex portion, if $SiO_2$ had been eliminated, the SiN residual film thickness was measured.

(Flatness Evaluation)

The wafer for evaluation mentioned above was first subjected to rough-machining polishing. The wafer for evaluation was fixed onto the substrate holder of a polishing apparatus (model number: EPO-111, manufactured by Ebara Corp.), and in the meantime, an IC-1000 (model number, manufactured by Rodel-Nitta Company; groove shape: perforate) polishing pad was attached to a polishing platen having a diameter of 600 mm. The substrate holder was pressed against the polishing pad such that the surface of the insulating film 4 would be brought into contact with the pad, and the processing load was set at 30 kPa. While a polishing agent (cerium hydroxide concentration 0.5%) prepared by mixing 500 g of the concentrated cerium hydroxide slurry described above and 500 g of water, and adding a 5 wt % aqueous solution of imidazole until the pH reached 6.5, was dropped on the polishing pad at a rate of 200 mL/min, the platen and the substrate holder were respectively operated at 50 rpm, and thereby the wafer for evaluation was polished for 140 seconds. Thus, a rough-machined wafer was obtained. The $SiO_2$ residual film thicknesses at the convex portions in the 100/100 pattern of the center were about 200 nm.

The rough-machined wafer thus obtained was subjected to finishing polishing using the polishing agents prepared in Examples 4 and 5 and Comparative Example 3 that will be described below. Polishing was performed in the same manner as in the rough machining described above, except that the polishing pad and the pad were changed, and polishing was carried out until the SiN at the convex portions in the 100/100 pattern of the center was exposed.

The evaluation of flatness was carried out by measuring the level difference between the convex portion and the concave portion each in the 500/500 pattern, the 100/100 pattern and the 25/25 pattern of the center by using a contact type surface shape analyzer (trade name: Dektak V200Si, manufactured by Veeco Instruments, Inc., USA), by setting the needle pressure at 5 mg.

Example 4

As a polishing agent, a concentrated additive liquid containing 2% by weight of DAICHITOSAN 100D (VL) (trade name, very low viscosity chitosan manufactured by Dainichi Seika Color & Chemicals Manufacturing Co., Ltd.; degree of deacetylation 98% or greater, viscosity of a solution in the case of dissolving chitosan at a proportion of 0.5% in a 0.5% aqueous solution of acetic acid: 6 mPa·s), 1% by weight of acetic acid, and 97% by weight of water, was prepared. 48 g of this concentrated additive liquid, 320 g of the concentrated cerium hydroxide slurry obtained as described above, and 1232 g of water were mixed, and a 10 wt % aqueous solution of imidazole was added thereto until the pH reached 6.5. The polishing agent thus prepared (cerium hydroxide concentration 0.2%, DAICHITOSAN 100D (VL) concentration 0.06%) was used, and a polyurethane pad having a Shore D hardness of 87 was used, to perform the finishing polishing.

Example 5

As a polishing agent, a concentrated additive liquid containing 2% by weight of the DAICHITOSAN 100D (VL), 1% by weight of acetic acid, 1% by weight of polyvinyl alcohol (manufactured by Wako Pure Chemical Industries, Ltd., degree of polymerization about 2000), and 96% by weight of water, was prepared. 48 g of this concentrated additive liquid, 320 g of the concentrated cerium hydroxide slurry obtained as described above, and 1232 g of water were mixed, and a 10 wt % aqueous solution of imidazole was added thereto until the pH reached 6.5. The polishing agent thus prepared (cerium hydroxide concentration 0.2%, DAICHITOSAN 100D (VL) concentration 0.06%, polyvinyl alcohol concentration 0.03%) was used, and a polyurethane pad having a Shore D hardness of 87 was used, to perform the finishing polishing.

Comparative Example 3

As a polishing agent, 100 g of the concentrated cerium oxide slurry of Comparative Example 2, 5 g of a commercially available aqueous solution of polyacrylic acid ammonium salt (40% by weight), and 895 g of water were mixed, and 1 N nitric acid was added thereto until the pH reached 4.5. The polishing agent thus prepared (cerium oxide concentration 0.5%, polyacrylic acid ammonium salt concentration 0.2%) was used to perform the finishing polishing as described above.

The level differences in the 500/500 pattern, the 100/100 pattern, and the 25/25 pattern of the center of Examples 4 and 5 and Comparative Example 3 are presented in Table 2. It was clearly shown that it is possible to achieve flat polishing by using the polishing agents of the present invention.

TABLE 2

| Item | Polishing particles and concentration (%) | Additive and concentration (%) | Level difference (nm) | | |
|---|---|---|---|---|---|
| | | | 500/500 | 100/100 | 25/25 |
| Example 4 | Cerium hydroxide 0.2% | DAICHITOSAN 100D (VL) 0.06% | 32 | 25 | 9 |
| Example 5 | Cerium hydroxide 0.2% | DAICHITOSAN 100D (VL) 0.06% Polyvinyl alcohol 0.03% | 20 | 15 | 4 |
| Comparative Example 3 | Cerium oxide 0.5% | Polyacrylic acid ammonia salt 0.2% | 74 | 26 | 13 |

(Evaluation of Stability of Polishing Agent)

Example 6

The change over time in the average particle size of the polishing agent prepared in Example 4 (cerium hydroxide concentration 0.2%, DAICHITOSAN 100D (VL) concentration 0.06%, pH=6.5) was traced. Even when the polishing agent was left to stand for 100 hours at 25° C., the average particle size did not undergo a change.

Comparative Example 4

A polishing agent was prepared by mixing 320 g of the concentrated cerium hydroxide slurry obtained as described above, with 1232 g of water, and adding thereto a 10 wt % aqueous solution of imidazole until the pH reached 6.5 (cerium hydroxide concentration 0.2%, pH=6.5). The change over time in the average particle size was traced, and after 10 hours at 25° C., the average particle size increased to 171%. Furthermore, after 24 hours, precipitation of the polishing particles was recognized.

It was found clear from Example 6 and Comparative Example 4 that the addition of chitosan suppresses changes in the particle size, and is also highly effective in the enhancement of stability of the polishing agent.

(Lowering of Concentration of Polishing Particles)

Example 7

A polishing agent was prepared by mixing 100 g of a concentrated additive liquid containing 0.6% by weight of DAICHITOSAN 100D (VL) mentioned above, 0.5% by weight of acetic acid, 0.64% by weight of imidazole, and 98.26% by weight of water, 200 g of the concentrated cerium hydroxide slurry described above, and 700 g of water (cerium hydroxide concentration 0.2%, DAICHITOSAN 100D (VL) concentration 0.06%). The pH of the polishing agent was 6.3. As a polishing pad, a polyurethane pad having a Shore D hardness of 81 was used, and polishing was performed in the same manner as in Example 1. Polishing rate for the silicon oxide, polishing rate for the silicon nitride, and the selection ratio were determined.

In addition, this polishing agent was diluted 2 times, 4 times, 10 times and 50 times using pure water, and polishing rates for the silicon oxide, polishing rates for the silicon nitride and the selection ratios were determined by the same method.

Comparative Example 5

100 g of a concentrated additive liquid containing 0.5% by weight of acetic acid, 0.64% by weight of imidazole and 98.86% by weight of water, 200 g of the concentrated cerium hydroxide slurry obtained as described above, and 700 g of water were mixed, and thereby a polishing agent that did not contain chitosan was prepared (cerium hydroxide concentration 0.2%). The pH of the polishing agent was 6.3. As a polishing pad, a polyurethane pad having a Shore D hardness of 81 was used, and polishing was performed in the same manner as in Example 1. Polishing rate for the silicon oxide, polishing rate for the silicon nitride, and the selection ratio were determined.

In addition, this polishing agent was diluted 2 times and 10 times using pure water, and polishing rates for the silicon oxide, polishing rates for the silicon nitride and the selection ratios were determined by the same method.

Comparative Example 6

The polishing agent prepared in Comparative Example 2 (cerium oxide concentration 0.5% by weight) was diluted 2.5 times and 10 times with pure water, and polishing was performed in the same manner as in Example 1. Polishing rate for the silicon oxide, polishing rate for the silicon nitride, and the selection ratio were determined.

Polishing rates for the silicon oxide, polishing rates for the silicon nitride and selection ratios of Example 7, Comparative Example 2 and Comparative Examples 5 and 6 are presented in Table 3. It was clearly shown that the polishing agents of the present invention are capable of obtaining high polishing rates even at low concentrations of the polishing particles.

TABLE 3

| Item | Polishing particles and concentration (wt %) | Polymer or Polysaccharide and concentration (wt %) | Polishing rate for the silicon oxide (nm/min) | Polishing rate for the silicon nitride (nm/min) | Selection ratio |
|---|---|---|---|---|---|
| Example 7 | Cerium hydroxide 0.2% | Chitosan 0.06% | 90 | 6.0 | 15 |
| | Cerium hydroxide 0.1% | Chitosan 0.03% | 105 | 7.0 | 15 |
| | Cerium hydroxide 0.05% | Chitosan 0.015% | 100 | 4.8 | 21 |
| | Cerium hydroxide 0.02% | Chitosan 0.006% | 202 | 5.4 | 37 |
| | Cerium hydroxide 0.004% | Chitosan 0.0012% | 60 | 4.0 | 15 |
| Comparative Example 5 | Cerium hydroxide 0.2% | — | 150 | 50 | 3 |
| | Cerium hydroxide 0.1% | — | 90 | 30 | 3 |
| | Cerium hydroxide 0.02% | — | 0 | — | — |
| Comparative Example 6 | Cerium oxide 0.2% | Polyacrylic acid ammonia salt 0.002% | 95 | 20 | 5 |
| | Cerium oxide 0.05% | Polyacrylic acid ammonia salt 0.0005% | 30 | 6 | 5 |

Example 8

2.5 g of a concentrated additive liquid containing 1% by weight of an allylamine polymer (PAA-H-10C, manufactured by Nitto Boseki Co., Ltd.), 0.3% by weight of acetic acid, and 98.7% by weight of water, 100 g of the concentrated cerium hydroxide slurry described above, and 395 g of water were mixed, and a 5 wt % aqueous solution of imidazole was added thereto until the pH reached 5.5. Thus, a polishing agent was prepared. The average particle size was 100 nm, and the zeta potential was +47 mV. The average particle size and the zeta potential were measured in the same manner as described above.

Examples 9 and 10

A polishing agent was prepared in the same manner as in Example 8, except that the amount of addition of the concentrated additive liquid was changed to 5.0 g and 7.5 g.

Polishing the insulating film, pH, average particle size and zeta potential of the polishing agents prepared in Examples 8 to 10 and Comparative Examples 1 and 2 described above, were measured in the same manner as in Example 1. The results are summarized in Table 4. The relative number of polishing flaws was calculated by defining the number of polishing flaws of Comparative Example 2 as 1. As shown in Table 4, it is clear that the polishing agents of the present invention bring about a reduction in the polishing flaws and an enhancement of the selection ratio.

TABLE 4

| Item | Composition of polishing agent | | pH | Average particle size (nm) | Zeta potential (mV) | Polishing rate for the silicon oxide (nm/min) | Polishing rate for the silicon nitride (nm/min) | Selection ratio | Relative number of polishing flaws |
|---|---|---|---|---|---|---|---|---|---|
| | Polishing particles and concentration (wt %) | Additive and concentration (wt %) | | | | | | | |
| Example 8 | Cerium hydroxide 0.2 | PAA-H-10C 0.005 | 5.6 | 100 | +47 | 305 | 33 | 9 | 0.2 |
| Example 9 | Cerium hydroxide 0.2 | PAA-H-10C 0.010 | 5.6 | 100 | +45 | 280 | 20 | 14 | 0.3 |
| Example 10 | Cerium hydroxide 0.2 | PAA-H-10C 0.015 | 5.6 | 100 | +45 | 245 | 15 | 16 | 0.3 |
| Comparative Example 1 | Cerium hydroxide 0.2 | — | 5.76 | 100 | +44 | 305 | 120 | 3 | 0.3 |
| Comparative Example 2 | Cerium oxide 0.5 | Polyacrylic acid ammonia salt 0.005 | 4.15 | 120 | −54 | 218 | 46 | 5 | 1 |

Example 11

15 g of a concentrated additive liquid containing 1% by weight of an ethyleneimine polymer (trade name: EPOMIN (registered trademark) SP-200, manufactured by Nippon Shokubai Co., Ltd., number average molecular weight 10,000), 0.3% by weight of acetic acid and 98.7% by weight of water, 100 g of the concentrated cerium hydroxide slurry described above, and 385 g of water were mixed, and a 5 wt % aqueous solution of imidazole was added thereto until the pH reached 5.5. Thus, a polishing agent was prepared. The average particle size was 100 nm, and the zeta potential was +36 mV. The average particle size and the zeta potential were measured in the same manner as described above.

Examples 12 and 13

Polishing agents were prepared in the same manner as in Example 11, to have the compositions indicated in the following Table 5, by changing the amount of addition of the concentrated additive liquid to 25 g and 50 g.

Example 14

5 g of a concentrated additive liquid containing 1% by weight (in terms of polymer content) of an ethyleneimine polymer (trade name: EPOMIN P-1000, manufactured by Nippon Shokubai Co., Ltd., 30 wt % aqueous solution, number average molecular weight 70,000), 0.3% by weight of acetic acid, and 98.7% by weight of water, 100 g of the concentrated cerium hydroxide slurry described above, and 395 g of water were mixed, and a 5 wt % aqueous solution of imidazole was added thereto until the pH reached 5.5. Thus, a polishing agent was prepared.

Polishing the insulating film, pH, average particle size and zeta potential of the polishing agents prepared in Examples 11 to 14 and Comparative Examples 1 and 2 described above, were measured in the same manner as in Example 1. The results are summarized in Table 5. The relative number of polishing flaws was calculated by defining the number of polishing flaws of Comparative Example 2 as 1. As shown in Table 5, it is clear that the polishing agents of the present invention bring about a reduction in the polishing flaws and an enhancement of the selection ratio.

Example 15

(Synthesis of Additive)

15 g of N,N-dimethylaminopropylacrylamide (DMAPAA, manufactured by Kohj in Co., Ltd.) and 281 g of water were placed in a round bottom flask, and nitrogen gas was introduced therein. The content of the flask was heated to 80° C., and while the mixture was stirred, an aqueous solution formed from 696 mg of 2,2'-azobis(2-methylpropionamidine)dihydrochloride and 4 g of water was added to the flask. The mixture was heated and stirred for 2 hours at 80° C. and then was cooled to room temperature (25° C.), and thus a polymer (hereinafter, referred to as additive X) solution with a concentration of 5% by weight was obtained. The molecular weight was measured using a static light scattering method, and the molecular weight was found to be 23,000.

A polishing agent was prepared by mixing 1 g of the additive X solution (concentration 5% by weight) thus obtained, 0.25 g of acetic acid, 399 g of water, and 100 g of the concentrated cerium hydroxide slurry described above. The pH of the polishing agent was 5.70, the average particle size was 100 nm, and the zeta potential was +35 mV. The average particle size and the zeta potential were measured as described above.

Polishing the insulating film, pH, average particle size and zeta potential of the polishing agents prepared in Example 15 and Comparative Examples 1 and 2 described above, were measured in the same manner as in Example 1. The results are summarized in Table 6. The relative number of polishing flaws was calculated by defining the number of polishing flaws of Comparative Example 2 as 1. As shown in Table 6, it is clear that the polishing agents of the present invention bring about a reduction in the polishing flaws and an enhancement of the selection ratio.

TABLE 5

| Item | Composition of polishing agent | | PH | Average particle size (nm) | Zeta potential (mV) | Polishing rate for the silicon oxide (nm/min) | Polishing rate for the silicon nitride (nm/min) | Selection ratio | Relative number of polishing flaws |
| --- | --- | --- | --- | --- | --- | --- | --- | --- | --- |
| | Polishing particles and concentration (wt %) | Additive and concentration (wt %) | | | | | | | |
| Example 11 | Cerium hydroxide 0.2 | SP-200 0.03 | 5.61 | 100 | +36 | 262 | 28 | 9 | 0.2 |
| Example 12 | Cerium hydroxide 0.2 | SP-200 0.05 | 5.53 | 100 | +37 | 231 | 21 | 11 | 0.3 |
| Example 13 | Cerium hydroxide 0.2 | SP-200 0.10 | 5.58 | 100 | +36 | 197 | 17 | 12 | 0.3 |
| Example 14 | Cerium hydroxide 0.2 | P-1000 0.01 | 5.56 | 100 | +38 | 200 | 21 | 10 | 0.3 |
| Comparative Example 1 | Cerium hydroxide 0.2 | — | 5.76 | 100 | +44 | 305 | 120 | 3 | 0.3 |
| Comparative Example 2 | Cerium oxide 0.5 | Polyacrylic acid ammonia salt 0.005 | 4.15 | 120 | −54 | 218 | 46 | 5 | 1 |

TABLE 6

| | Composition of polishing agent | | | | | | | | |
|---|---|---|---|---|---|---|---|---|---|
| Item | Polishing particles and concentration (wt %) | Additive and concentration (wt %) | pH | Average particle size (nm) | Zeta potential (mV) | Polishing rate for the silicon oxide (nm/min) | Polishing rate for the silicon nitride (nm/min) | Selection ratio | Relative number of polishing flaws |
| Example 15 | Cerium hydroxide 0.2 | Additive X 0.01 | 5.70 | 100 | +35 | 210 | 21 | 10 | 0.2 |
| Comparative Example 1 | Cerium hydroxide 0.2 | — | 5.76 | 100 | +44 | 305 | 120 | 3 | 0.3 |
| Comparative Example 2 | Cerium oxide 0.5 | Polyacrylic acid ammonia salt 0.005 | 4.15 | 120 | −54 | 218 | 46 | 5 | 1 |

INDUSTRIAL APPLICABILITY

According to the present invention, it is an object of the invention to provide a polishing agent which is capable of polishing an insulating film at a high rate with less polishing flaws, in the CMP technology of flattening a shallow trench isolation insulating film, a pre-metal insulating film, an inter-layer insulating film or the like, and a method for polishing a substrate using this polishing agent.

It is another object of the invention to provide a polishing agent having a high polishing rate ratio of a silicon oxide film and a stopper film, a polishing agent set for storing the polishing agent, and a method for polishing a substrate using this polishing agent.

REFERENCE SIGNS LIST

1 SILICON OXIDE FILM
2 SILICON NITRIDE FILM
3 SILICON SUBSTRATE
L LINE WIDTH OF CONVEX PART
S LINE WIDTH OF CONCAVE PART

The invention claimed is:

1. A polishing agent comprising: water; tetravalent metal hydroxide particles; and an additive,
wherein the additive is a cationic polymer that includes at least one selected from the group consisting of polymers of groups (1) and (2) below, and derivatives thereof:
(1) a polymer which is a polymerization product of monomers consisting of at least one amine-containing monomer selected from the group consisting of allylamine, diallylamine and vinylamine, and
(2) a polymer which is a polymerization product of monomers consisting of at least one amine-containing monomer selected from the group consisting of allylamine, diallylamine and vinylamine, and at least one monomer compound selected from the group consisting of sulfur dioxide, maleic acid, fumaric acid and acrylamide.

2. The polishing agent according to claim 1, wherein the average particle size of the tetravalent metal hydroxide particles is within the range from 1 nm to 400 nm.

3. The polishing agent according to claim 1, wherein the pH of the polishing agent is within the range from 3.0 to 7.0.

4. The polishing agent according to claim 1, wherein the content of the tetravalent metal hydroxide particles is from 0.001 parts by weight to 5 parts by weight relative to 100 parts by weight of the polishing agent.

5. The polishing agent according to claim 1, wherein the zeta potential of the tetravalent metal hydroxide particles in the polishing agent is +10 mV or higher.

6. The polishing agent according to claim 1, wherein the content in total of the additive is 0.0001 parts by weight or more relative to 100 parts by weight of the polishing agent.

7. The polishing agent according to claim 1, which is used for polishing a surface to be polished containing at least silicon oxide at the surface.

8. The polishing agent according to claim 1, wherein the tetravalent metal hydroxide is at least one of rare earth metal hydroxides and zirconium hydroxide.

9. A method for polishing a substrate, the method comprising the steps of:
applying pressure on a substrate on which a film to be polished is formed by pressing the substrate against a polishing cloth of a polishing platen; and
moving the substrate and the polishing platen relatively to each other to polish the film to be polished while supplying the polishing agent according to claim 1 between the film to be polished and the polishing cloth.

10. The method for polishing according to claim 9, wherein a polishing cloth having a Shore D hardness of 70 or harder is used.

11. A polishing agent set comprising a slurry and an additive liquid, which are stored separately and mixed immediately before polishing or at the time of polishing to be the polishing agent according to claim 1,
wherein the slurry contains the tetravalent metal hydroxide particles and the water, and the additive liquid contains the additive and the water.

12. The polishing agent according to claim 1, wherein the polishing agent includes a further additive, the further additive being at least one selected from the group consisting of carboxylic acids, amino acids, amphoteric surfactants, anionic surfactants and cationic surfactants.

13. The polishing agent according to claim 1, wherein said additive is selected from the group consisting of an allylamine polymer, an allylamine hydrochloride polymer, an allylamine amide sulfate polymer, an allylamine hydrochloride-diallylamine hydrochloride copolymer, an allylamine acetate-diallylamine acetate copolymer, an allylamine hydrochloride-dimethylallylamine hydrochloride copolymer, an allylamine-dimethylallylamine copolymer, a partial methoxycarbonylated allylamine polymer, a partial methylcarbonylated allylamine acetate polymer, a diallylamine polymer, a diallylamine hydrochloride polymer, a methyldiallylamine hydrochloride polymer, a methyldiallylamine amide sulfate polymer, a methyldiallylamine acetate polymer, a diallyldimethylammonium chloride polymer, a diallylamine hydrochloride-sulfur dioxide copolymer, a diallylamine acetate-sulfur dioxide copolymer, a diallylmethylethylammonium ethylsulfate-sulfur dioxide copolymer, a methyldiallylamine hydrochloride-sulfur dioxide copolymer, a diallyldimethylammonium chloride-sulfur dioxide copolymer, a diallyldimethylammonium chloride-acrylamide copolymer, a partial 3-chloro-2-hydroxypropylated diallylamine hydrochloride-diallyldimethylammonium chloride copolymer, a diallylamine hydrochloride-maleic acid copolymer, a diallylamine amide sulfate-maleic acid copolymer, a maleic acid-diallyldimethylammonium chloride-sulfur dioxide copolymer, a vinylamine polymer, and a vinylamine copolymer.

14. A polishing agent comprising: water; tetravalent metal hydroxide particles; and an additive,
   wherein the additive is a cationic polymer that includes at least one selected from the group consisting of polymers of groups (1) and (2) below:
   (1) a polymer which is a polymerization product of monomers consisting of at least one amine-containing monomer selected from the group consisting of allylamine, diallylamine and vinylamine, and
   (2) a polymer which is a polymerization product of monomers consisting of at least one amine-containing monomer selected from the group consisting of allylamine, diallylamine and vinylamine, and at least one monomer compound selected from the group consisting of sulfur dioxide, maleic acid, fumaric acid and acrylamide, and derivatives thereof.

15. A polishing agent comprising: water; tetravalent metal hydroxide particles; and an additive,
   wherein the additive is a cationic polymer that includes at least one selected from the group consisting of polymers of groups (1) and (2) below:
   (1) a polymer which is a polymerization product of monomers consisting of at least one amine-containing monomer selected from the group consisting of allylamine, diallylamine and vinylamine, and
   (2) a polymer which is a polymerization product of monomers consisting of at least one amine-containing monomer selected from the group consisting of allylamine, diallylamine and vinylamine, and at least one monomer compound selected from the group consisting of sulfur dioxide, maleic acid, fumaric acid and acrylamide.

16. The polishing agent according to claim 1, wherein said cationic polymer consists of at least one selected from the group consisting of said polymers of the groups (1) and (2).

17. The polishing agent according to claim 14, wherein said cationic polymer consists of at least one selected from the group consisting of said polymers of the groups (1) and (2).

18. The polishing agent according to claim 15, wherein said cationic polymer consists of at least one selected from the group consisting of said polymers of the groups (1) and (2).

* * * * *